US005806171A

United States Patent [19]

Wang

[11] Patent Number: 5,806,171

[45] Date of Patent: Sep. 15, 1998

[54] METHOD AND APPARATUS FOR POLYMERIC TYPE POSITIVE TEMPERATURE COEFFICIENT THERMISTORS

[75] Inventor: Patrick Shui-Chung Wang, Repulse Bay, Hong Kong

[73] Assignee: Johnson Electric S.A., Switzerland

[21] Appl. No.: 652,929

[22] Filed: May 24, 1996

[30] Foreign Application Priority Data

May 26, 1995 [GB] United Kingdom .................... 9510713

[51] Int. Cl.[6] ............................ H01C 7/02; G01R 31/01

[52] U.S. Cl. ................................ 29/612; 29/593; 29/729

[58] Field of Search ............................ 29/612, 593, 729, 29/756; 338/22 R

[56] References Cited

U.S. PATENT DOCUMENTS 4,081,898 4/1978 Taylor, Jr. et al. ........................ 29/593

4,327,351 4/1982 Walker .

4,463,337 7/1984 Håkanson .................................. 29/612

5,353,699 10/1994 Tamura ..................................... 29/593

FOREIGN PATENT DOCUMENTS 0549060 12/1992 European Pat. Off. .

*Primary Examiner*—P. W. Echols

*Attorney, Agent, or Firm*—Ostrolenk, Faber, Gerb & Soffen, LLP

[57] ABSTRACT

Apparatus and method for producing polymeric type positive temperature coefficient resistor devices takes a strip of PTC material (100) preferably produced by a continuous extrusion and lamination process and cuts discrete devices (10) from the strip. The cutter (42) cuts the devices to a precise predetermined length and the resistance of each device is measured as it is cut. The predetermined length of each device to be cut is determined based on a desired resistance value of the device and the length and measured resistance of the just cut device. Printing station (55) adds indicia to the devices indicating relevant information about the devices.

15 Claims, 1 Drawing Sheet

METHOD AND APPARATUS FOR POLYMERIC TYPE POSITIVE TEMPERATURE COEFFICIENT THERMISTORS

This invention relates to apparatus and method for producing and checking slab type polymeric positive temperature coefficient resistors or thermistors (PTC's) produced by a continuous forming process.

Polymeric PTC's are of laminated form having a polymer layer sandwiched between conductive layers, usually of nickel or nickel-based material forming electrodes or terminals. These conductive layers may be extremely thin, e.g., nickel foil or copper plated nickel foil. Additional coatings may be provided between or on the layers to protect the terminals from corrosion, to provide better electrical contact with the connectors or to aid adhesion of the electrodes to the polymer layer.

The structural features of a polymeric PTC and its operating characteristics are well known, see for example, Raychem Corporation's "Polyswitch" circuit protection devices range of products, and thus, will only be described simply here to give a basic understanding of their function to enable the fundamental principles of the invention to be appreciated.

PTC's may be likened to a switch or a fuse. The polymer layer allows conduction between the electrodes under normal operating conditions and temperature. When the temperature of the polymer reaches a particular value, known as the trip temperature, the resistance of the polymeric layer increases substantially to effectively open circuit the electrodes. This temperature rise may be the result of ambient temperature rise or a self-heating effect of the current flowing through the device. It is this latter application in which we are particularly interested which allows the PTC to act as a fuse. Once tripped, the device is not strictly open circuit but merely provides a high resistance. This high resistance is sufficient to consider the device as an open circuit for practical purposes in the circuit under consideration but the high resistance does allow sufficient current to pass through the device to maintain the device in the tripped (i.e., high resistance) state. However, once the power is turned off to the device, the maintaining current is removed allowing the polymeric layer to cool down and the device returns to its conductive or low impedance state, i.e., it is reset.

The operating characteristics of a PTC device may be changed by modifying the volume of the polymeric layer and the composition of the polymer. A greater volume can mean a slower trip time at a particular applied current all other factors being equal. However, both thickness and the surface area of the slab vary the resistance and hence, the trip current.

In one method of manufacturing PTC's, a large slab of conductive polymeric material is formed, the electrodes are applied to the slab in a lamination process involving pressing the assembled slab while still hot to the desired thickness. This large slab is then cut into a number of devices of predetermined size. Thus formed devices are then measured to determine compliance with required characteristics and adjustments to the polymer mix may be made when out of tolerance characteristics are recorded. This usually is only required when mixing a new batch of polymer material or when PTC's of different characteristics are being produced. Also, due to the large area of the slab, variations occur across and along the slab so usually, only one or two reference samples are taken from each slab and from the same locations. Variations within the slab cause a large reject rate when applications require closely matched PTC characteristics.

A recent development in producing polymeric PTC's is the so-called continuous forming process in which a strip of polymeric material, one device wide, is extruded through a die and immediately laminated with the electrodes in a continuous process and then cut to length, either in a final size length or in long strips for later separation. The die produces these strips in a single pre-determined width and thickness and thus, variations across the slab or strip is the same for each device produced. The width and thickness is determined by the dimensions of the slot in the die. Thus, variation between devices is an indication of how evenly the polymer mix is prepared, i.e., variations between devices are more likely to be due to variations in the polymer mix and not to variations in the thickness between devices.

For a truly homogenous polymer mix, each device being cut to the same length should have identical characteristics but in reality, this does not occur and slight variations do occur between devices even though they are cut to the same size. Thickness variations may also occur due to variations in extrusion pressure and the pressure applied by the lamination rollers. While these variations are a vast improvement over the slab type manufacturing process, these variations may be unacceptable in certain applications.

Accordingly, the present invention seeks to eliminate or at least reduce these variations between devices of the same batch to acceptable levels. This is achieved by varying the cut length or surface area of the devices to compensate for other variations affecting characteristics of the devices. The cut length or surface area is determined based on the measured characteristics of the most recently cut devices.

Accordingly, the present invention provides a method of preparing polymeric type positive temperature coefficient resistor devices, the method comprising the steps of taking a strip of polymeric type positive temperature coefficient resistor material, cutting a device of predetermined length from the strip, measuring the resistance of the device, comparing the measured resistance with a predetermined desired resistance, determining a new predetermined shape of the device based on the previous predetermined shape, measured resistance and desired resistance, and cutting a further device from the strip with a shape equal to the new predetermined shape.

BRIEF DESCRIPTION OF THE DRAWINGS

The preferred embodiment of the invention will now be described by way of example only with reference to the accompanying drawings in which.

DETAILED DESCRIPTION OF THE PREFERRED EMBODIMENT

Figure 1:
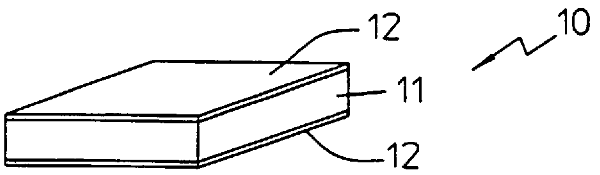
FIG. 1 is a perspective view of a polymeric type PTC.

As illustrated in FIG. 1, polymeric type PTC's 10 have a conductive polymer based central layer 11 laminated between outer electrodes or terminals 12 being layers of conductive material such as nickel foil with or without coatings according to the application. The construction of polymeric type PTC's is well known and their features, functions and operations will not be fully explained here except to indicate that the polymer based central layer usually comprises a crystalline polyolefin or fluoro polymer matrices in which carbon black or other conductive particles are dispersed. Resistivity of the polymer is determined by the type of conductive particles used as well as by the volume ratio of conductive particles to polymer. The resistivity is also affected by the size of the device, both thickness of the layer and the surface area (length×width). Resistance is the single most important factor in a PTC's performance, affecting hold current, trip current and time to trip. Resistance in the conductive state is typically in the order of 10 milliohms.

For a given production, the size of the PTC, i.e., length, width and thickness, is usually predetermined within production tolerances and the carbon black loading is predetermined for a particular batch which means that PTC's produced in one batch may all be rejected due to slight variations in the carbon black loading in the polymer mix.

It is possible to correct the polymer mix in the continuous forming process, described above, in which a strip of polymer layer is extruded through an extrusion die. The extrusion die forms or sets the width and the thickness of the extruded layer. The thickness may be changed slightly during the lamination process where the nickel foil layers are pressed into contact with and attached to the polymer layer. However, the variation in thickness is or should be consistent and can be taken into account when forming the die. Traditionally, the size of each PTC is predetermined, i.e., for a particular run, the length of the devices cut from the strip is fixed so that size is not a production variation. One piece cut from the strip would be selected, usually the first device, and tested to see if any adjustment to the composition of the polymer mix is required for the next batch. Testing involves taking a resistance measurement and comparing its resistance to the expected value for this size device.

In the continuous extrusion method, the mixing of the conductive polymer material can be continuous with hoppers feeding the ingredients into a mixing chamber of modest dimensions which feeds directly into or forms part of the extrusion compression chamber. However, the time lag for changes in composition input to be reflected in devices produced is significant.

By maintaining the composition as predominantly fixed (although variations could be made as required or considered necessary or prudent), any slight variations from ideal can be accommodated by varying the cut length of each device using the measured resistance value and known cut length of the last device produced to determine the cut length of the next device to be produced. Feedback is immediate and can thus accommodate slight variations in mixing quality of the polymer base and/or variations in thickness introduced by the lamination process.

Therefore, as each device is cut from the continuously formed strip of PTC material, its resistance is measured. This value is then compared with the ideal value and any variation in the cut length required to maintain resistance within desired limits is made before the next device is cut from the strip and so on, on the assumption that the composition of the mix is substantially consistent between consecutively produced devices.

As each device is measured as it is cut, devices with resistance values outside of acceptable levels can be immediately rejected, ensuring integrity of the batch. To start the process, the very first device to be cut from a new strip would be cut to a predetermined reference length.

Figure 2:
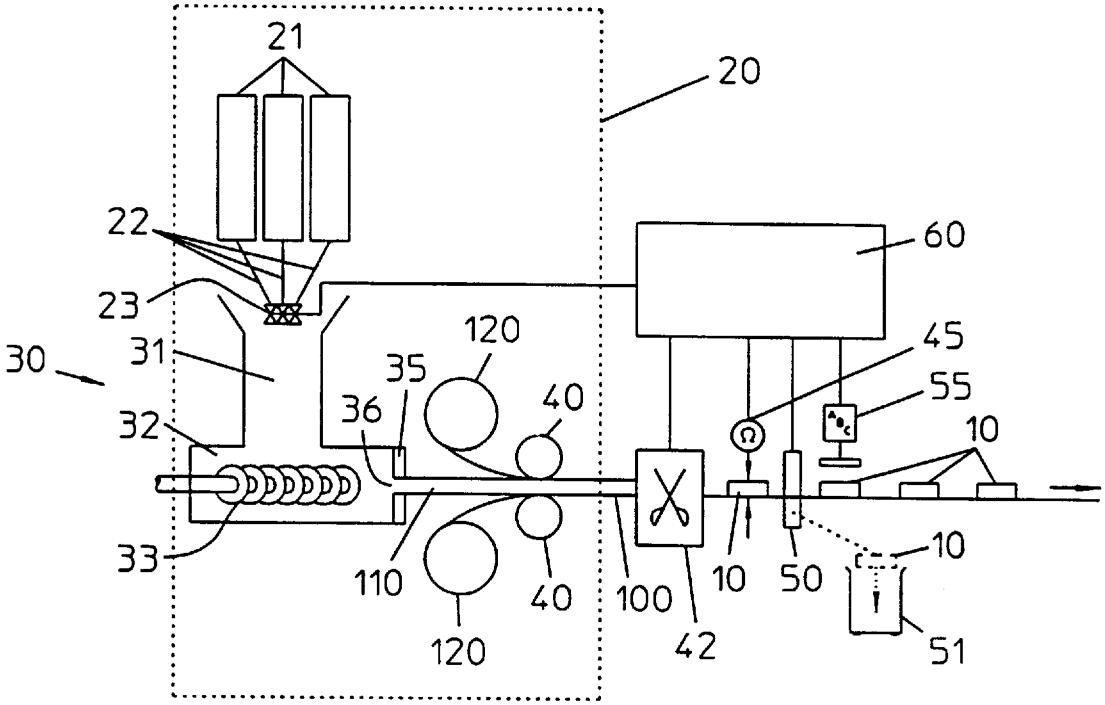
FIG. 2 is a simplified schematic diagram of a process for producing PTC's according to the invention.

The preferred apparatus, as shown in FIG. 2, includes a continuous forming extrusion and laminating apparatus generally indicated by reference numeral 20. This is of conventional design and has raw material supply bins 21 from which raw material is fed via feed chutes 22 and control valves 23 into a mixing chamber 31 of the extrusion machine 30 where the material is mixed to form the conductive polymer material. A compression chamber 32 is located in the base of the mixing chamber and has a compression screw 33 which forces the mixed polymer material through a hole 36 in the extrusion die 35. Hole 36 is dimensioned to produce a strip of polymer material 110.

Strip 110 is then passed through the lamination section where it is laminated with nickel foil. Two rolls of nickel foil 120 cut to the correct width supply the nickel foil to the upper and lower surfaces of the strip which then passes between two compression and lamination rollers 40 to effect bonding of the foil to the central layer, thus forming the PTC strip 100.

The PTC strip 100 then progresses to the cutting section 42 where it is cut into discrete PTC resistors or devices 10. The length of each cut is precisely controlled and is variable from one cut to the next. As each device 10 is cut, its resistance is measured at a resistance measuring station 45. The measured resistance is compared with expected values and the device is either rejected by rejecter 50 diverting it to a reject bin 51 or accepted and passed to a printing station 55 for marking with appropriate indicia, for example, model no. and/or resistance value.

Alternately, rejected devices may pass through the printing station and thus be marked appropriately before being diverted to the reject bin 51 to aid later reclassification or easy identification of reject devices. From the printing section 55, the discrete devices 10 may continue to other sections not shown for further processing and/or packing for transportation and storage.

It is preferred that the printing station is an ink jet type printing system to print readable or machine readable information although it may provide a simple colour code identification.

Each of the sections or stations of the apparatus may be controlled by a central controller 60 which supervises the running of the apparatus. The controller regulates the control valves 23 of the feed bins 21 to ensure precise composition of the conductive polymer mix. The controller 60 receives information of the resistance measuring station 45 which it uses to calculate or otherwise determine (e.g., by use of lookup tables) the length of the next cut to be made by the cutting station 42. It advises the rejecter if a device is to be rejected and provides the printing station 55 with information for marking the devices 10. Where appropriate, the controller may also control the composition of the conductive polymer material by regulating the control valves 23 of the supply bins 21.

Figure 3:
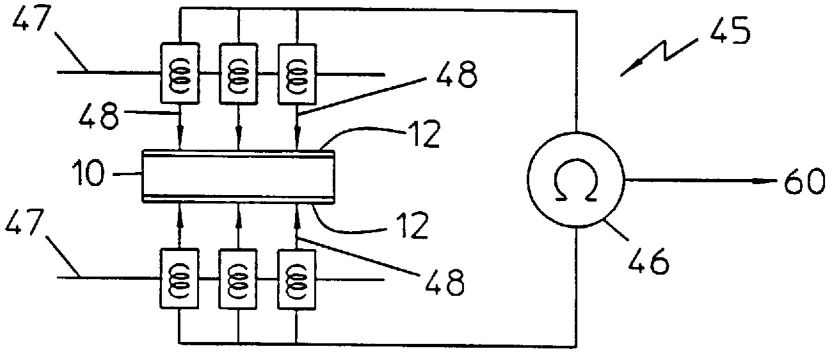
FIG. 3 is a schematic diagram illustrating a method of measuring the resistance of a PTC.

As each device 10 is cut from the continuous strip 100, its resistance is measured. As the resistance of each device is in milliohms, care must be taken with this measurement and FIG. 3 illustrates a preferred way of taking this measurement. Probes 47 of a resistance measuring device 46 are brought into contact with respective terminals 12 of the device 10. Each probe 47 has three fingers comprising gold or gold plated spring loaded spikes 48 to make point contact with the surface of the PTC device 10. The spikes are spring loaded to ensure a consistent probe pressure is applied to each device as probe pressure may influence the resistance reading. In this way, probe pressure will not be a factor causing variations in readings between devices produced in the same machine. Also, each probe has three fingers to ensure good contact with the terminal surface and is not as susceptible to fluctuations due to surface contamination as a single contact point.

While the embodiment shown illustrates a printer, preferably of the ink jet type, printing indicia onto the devices after their resistance value has been measured, this is purely an optional feature. However, an advantage of this optional feature is that each device is then labelled with an indication of its operating characteristics or some other relevant indicia such as a serial number or product code to allow easy product identification post production and for quality audit purposes.

Obviously, the speed of production will be limited by how quickly each device can be cut and the resistivity of each new device can be measured with any changes necessary being made to the cut length of the cutting device. However, it is envisaged that only minor variations, if any, between each cutting stop will be required. Also, accuracy of the cut length and allowable tolerance of the devices may influence the speed of production.

While the preferred embodiment varies the length of the discrete devices cut from the strip, producing discrete devices with a rectangular plan projection (or shadow), the cutting section could be arranged to produce discrete devices with other plan projection shapes to vary the surface area and thus the volume of the discrete devices in order to vary the resistance of the discrete devices. This is particularly helpful if the discrete devices are cut from a slab or a strip wider than the desired dimensions of the final device. Also while the strip has been described as having a width equal to the width of the discrete devices, it may be that the width of the strip is equal to the length of the devices with the cut length being shorter than the width of the strip and thus the cut length becomes the width of the discrete devices.

I claim:

1. A method of preparing polymeric type positive temperature coefficient resistor devices, the method comprising the steps of:

taking a piece of polymeric type positive temperature coefficient resistor (PTC) material;

cutting a device of predetermined size from the piece;

measuring the resistance of the device;

comparing the measured resistance with a predetermined desired resistance;

determining a new predetermined size of the device based on the previous predetermined size, measured resistance and desired resistance; and cutting a further device from the piece with a size equal to the new predetermined size.

2. A method as defined in claim 1, wherein the last device cut is used to determine the predetermined size for the next device to be cut from the piece.

3. A method as defined in claims 1, wherein the length of the first device to be cut from the piece is predetermined based upon a desired resistance value and the composition of the PTC material.

4. A method as defined in claim 1 wherein the piece of PTC material is an elongate strip having a known width and thickness, and device is formed by cutting a length from the strip according to the predetermined size.

5. A method as defined in claim 1 further comprising the step of printing indicia on each device after its resistance has been measured.

6. A method as defined in claim 5, wherein the indicia printed on each device is dependent on the measured resistance of that device.

7. A method as defined in claim 1 further including rejecting devices with a measured resistance value which is not within predetermined values.

8. A method as defined in claim 1, wherein the step of measuring the resistance of the device includes contacting terminal surfaces of the device with a respective probe having spring loaded contact fingers and measuring the resistance between the probes.

9. A method as defined in claim 8, wherein each probe has multiple spring loaded fingers for making point contact with the device and the probes are brought into contact with the device such that contact pressure of the probe onto the device is generated by the springs of the fingers.

10. Apparatus for cutting polymer type positive temperature coefficient resistor devices from a piece of polymeric type positive temperature coefficient resistor material, said apparatus comprising:

a cutter for cutting a device of precise predetermined size from the piece;

a resistance measuring means for measuring the resistance of the device just cut from the piece; and means for determining the predetermined size of the next device to be cut from the piece based on the size and resistance of the last device cut from the piece and a predetermined desired resistance value.

11. Apparatus as defined in claim 10 further comprising marking means for printing indicia on the devices, the indicia being indicative of a characteristic of the device.

12. Apparatus as defined in claim 10, wherein the resistance measuring means includes probes for contacting respective terminal surfaces of the device, the probes having spring loaded fingers for making contact with the terminal surfaces with a predetermined contact force.

13. Apparatus for cutting polymer type positive temperature coefficient resistor devices from a strip of polymeric type positive temperature coefficient resistor material, said apparatus comprising:

a cutter for cutting a device of precise predetermined length from the strip;

a resistance measuring means for measuring the resistance of the device just cut from the strip; and means for determining the predetermined length of the next device to be cut from the strip based on the length and resistance of the last device cut from the strip and a predetermined desired resistance value.

14. Apparatus as defined in claim 13 further comprising marking means for printing indicia on the devices, the indicia being indicative of a characteristic of the device.

15. Apparatus as defined in claim 13, wherein the resistance measuring means includes probes for contacting respective terminal surfaces of the device, the probes having spring loaded fingers for making contact with the terminal surfaces with a predetermined contact force.

* * * * *